(12) United States Patent
Kakuya et al.

(10) Patent No.: US 8,463,200 B2
(45) Date of Patent: Jun. 11, 2013

(54) WIRELESS COMMUNICATION APPARATUS

(75) Inventors: Yuuji Kakuya, Okazaki (JP); Akira Takaoka, Okazaki (JP); Munenori Matsumoto, Kariya (JP); Tomotsugu Sekine, Nagoya (JP)

(73) Assignees: DENSO CORPORATION, Kariya (JP); Nippon Soken, Inc., Nishio (JP)

( * ) Notice: Subject to any disclaimer, the term of this patent is extended or adjusted under 35 U.S.C. 154(b) by 154 days.

(21) Appl. No.: 13/068,740

(22) Filed: May 19, 2011

(65) Prior Publication Data

US 2011/0287732 A1 Nov. 24, 2011

(30) Foreign Application Priority Data

May 20, 2010 (JP) .................................. 2010-116537

(51) Int. Cl.
*H04B 1/44* (2006.01)

(52) U.S. Cl.
USPC ................. 455/78; 455/334; 455/73; 455/82; 455/91; 455/226.2; 455/232.1; 455/293; 455/575.7; 455/129; 455/193.1

(58) Field of Classification Search
USPC ............... 455/8, 73, 82, 91, 334, 93.1, 226.2, 455/232.1, 293, 575.7, 121, 129, 193.1
See application file for complete search history.

(56) References Cited

U.S. PATENT DOCUMENTS

| | | | |
|---|---|---|---|
| 6,845,126 B2 * | 1/2005 | Dent et al. | 375/219 |
| 7,212,798 B1 * | 5/2007 | Adams et al. | 455/251.1 |
| 2003/0146875 A1 * | 8/2003 | Kirino | 343/702 |
| 2004/0264227 A1 * | 12/2004 | Kojima et al. | 365/45 |
| 2007/0251309 A1 * | 11/2007 | Katou | 73/146 |
| 2009/0245425 A1 * | 10/2009 | Tsutsui et al. | 375/319 |
| 2010/0144295 A1 * | 6/2010 | Kroeger et al. | 455/193.1 |
| 2011/0223878 A1 * | 9/2011 | Lin et al. | 455/226.2 |
| 2011/0294452 A1 * | 12/2011 | Kawai et al. | 455/293 |

FOREIGN PATENT DOCUMENTS

| | | |
|---|---|---|
| JP | 06-090186 | 3/1994 |
| JP | 2001-244717 | 9/2001 |
| JP | 2007-290664 | 11/2007 |

* cited by examiner

*Primary Examiner* — Temesgh Ghebretinsae
*Assistant Examiner* — Md Talukder
(74) *Attorney, Agent, or Firm* — Harness, Dickey & Pierce, PLC

(57) ABSTRACT

In a wireless communication apparatus, when a first switch electrically connects a second antenna to an impedance matching circuit and a second switch electrically connects a first antenna to a reception circuit, a frequency signal output from an oscillator of the reception circuit is received by the second antenna and applied to the impedance matching circuit. Then, a controller controls the impedance of the impedance matching circuit so as to bring a RSSI voltage output from a signal strength detection circuit of the reception circuit into agreement with a reference RSSI voltage, thereby bringing the reference frequency of the first antenna into agreement with a reference frequency.

12 Claims, 9 Drawing Sheets

WIRELESS COMMUNICATION APPARATUS

CROSS-REFERENCE TO RELATED APPLICATION

This application is based on and claims priority from Japanese Patent Application No. 2010-116537, filed on May 20, 2010, the content of which is hereby incorporated by reference in its entirety into this application.

BACKGROUND

1. Technical Field

The present invention relates to wireless communication apparatuses that receive signals via antennas.

2. Description of Related Art

A conventional wireless communication apparatus includes an antenna for receiving predetermined signals having a reference frequency, a resonance circuit that includes a capacitor and resonates with the antenna, a capacitance varying circuit that varies the capacitance of the capacitor of the resonance circuit, an oscillation circuit that applies a test signal to the resonance circuit, a voltage detection circuit that detects the output voltage of the resonance circuit, and a control circuit that controls the capacitance of the capacitor of the resonance circuit by controlling both the oscillation circuit and the capacitance varying circuit (see, for example, Japanese Patent Application Publication No. 2007-290664).

More specifically, the control circuit controls the oscillation circuit to vary the frequency of the test signal that is applied by the oscillation circuit to the resonance circuit. When the amplitude of the output voltage of the resonance circuit detected by the voltage detection circuit reaches its peak, the control circuit detects the then frequency of the test signal as a measured resonance frequency. Further, the control circuit controls the capacitance varying circuit to vary the capacitance of the capacitor of the resonance circuit, thereby bringing the measured resonance frequency into agreement with the reference frequency of the predetermined signals.

With the above configuration, when the capacitance of the capacitor of the resonance circuit is changed due to a change in temperature, it is still possible to keep the resonance of the resonance circuit with the antenna at a high level.

On the other hand, when the impedance of the antenna is changed due to a change in arrangement of metal members around the antenna, the resonance frequency of the antenna will deviate from the reference frequency of the predetermined signals. However, from the prior art, it is unknown how to bring the resonance frequency of the antenna back into agreement with the reference frequency of the predetermined signals in such cases.

SUMMARY

According to the present invention, there is provided a first wireless communication apparatus which includes a first antenna, a reception circuit, an impedance matching circuit, a second antenna, first and second switches, a signal processor and a controller. The first antenna is provided for receiving a predetermined signal that is transmitted by an external transmitter at a reference frequency. The reception circuit includes a frequency conversion circuit and a signal strength detection circuit. The frequency conversion circuit includes an oscillator that outputs a frequency signal at a predetermined frequency. The frequency conversion circuit is configured to frequency-convert signals input to the reception circuit based on the frequency signal output from the oscillator. The signal strength detection circuit is configured to detect the strength of the frequency-converted signals output from the frequency conversion circuit and output an RSSI (Received Signal Strength Indication) voltage that represents the detected strength. The impedance matching circuit performs impedance matching, between the first antenna and the reception circuit. The impedance matching circuit has a variable impedance. The second antenna is provided for receiving the frequency signal output from the oscillator of the frequency conversion circuit of the reception circuit. The first switch is arranged to selectively electrically connect one of the second antenna and the reception circuit to the impedance matching circuit while disconnecting the other from the impedance matching circuit. The second switch is arranged to selectively electrically connect and disconnect the first antenna to and from the reception circuit. When the first switch electrically connects the reception circuit to the impedance matching circuit and the second switch electrically disconnects the first antenna from the reception circuit so that the predetermined signal received by the first antenna is input to the frequency conversion circuit of the reception circuit via the impedance matching circuit and the first switch, the signal processor processes the frequency-converted signal output from the frequency conversion circuit. When the first switch electrically connects the second antenna to the impedance matching circuit and the second switch electrically connects the first antenna to the reception circuit so that the frequency signal received by the second antenna is applied to the impedance matching circuit, the controller controls the impedance of the impedance matching circuit so as to bring the RSSI voltage output from the signal strength detection circuit of the reception circuit into agreement with a reference RSSI voltage.

With the above configuration, the first wireless communication apparatus can selectively operate in either a tuning mode or a reception mode. In the tuning mode, the first switch electrically connects the second antenna to the impedance matching circuit and the second switch electrically connects the first antenna to the reception circuit so that the frequency signal received by the second antenna is applied to the impedance matching circuit; the controller controls the impedance of the impedance matching circuit to bring the RSSI voltage output from the signal strength detection circuit into agreement with the reference RSSI voltage, thereby bringing the resonance frequency of the first antenna into agreement with the reference frequency. In the reception mode, the first switch electrically connects the reception circuit to the impedance matching circuit and the second switch electrically disconnects the first antenna from the reception circuit so that the predetermined signal received by the first antenna is input to the frequency conversion circuit of the reception circuit via the impedance matching circuit and the first switch; the signal processor performs various tasks by processing the frequency-converted signal output from the frequency conversion circuit of the reception circuit.

Consequently, when the impedance of the first antenna is changed due to a change in arrangement of metal members around the first antenna and the resonance frequency of the first antenna is deviated from the reference frequency due to the change in the impedance, it is possible for the controller to bring the resonance frequency of the first antenna back into agreement with the reference frequency by controlling the impedance of the impedance matching circuit. As a result, the receiver sensitivity of the first wireless communication apparatus to the predetermined signal transmitted by the external transmitter can be maximized despite the change in arrangement of metal members around the first antenna.

Moreover, since the single oscillator is used for both the frequency conversion by the frequency conversion circuit in the reception mode and the recovery of the resonance frequency of the first antenna to the reference frequency in the tuning mode, it is possible to reduce both the parts count and size of the first wireless communication apparatus.

Furthermore, in the first wireless communication apparatus, the frequency signal output from the oscillator of the reception circuit is wirelessly applied to the impedance matching circuit via the second antenna. Therefore, when the reception circuit is implemented by an Integrated Circuit (IC), it is unnecessary to wire between the IC and the impedance matching circuit and thus unnecessary to modify the IC.

According to the present invention, there is also provided a second wireless communication apparatus which includes an antenna, a reception circuit, an impedance matching circuit, first and second switches, a signal processor and a controller. The antenna is provided for receiving both a predetermined signal that is transmitted by an external transmitter at a reference frequency and a frequency signal that is output by an oscillator at a predetermined frequency. The reception circuit includes a frequency conversion circuit and a signal strength detection circuit. The frequency conversion circuit includes the oscillator and is configured to frequency-convert signals input to the reception circuit based on the frequency signal output from the oscillator. The signal strength detection circuit is configured to detect the strength of the frequency-converted signals output from the frequency conversion circuit and output an RSSI voltage that represents the detected strength. The impedance matching circuit performs impedance matching between the antenna and the reception circuit. The impedance matching circuit has a variable impedance. The first switch is arranged to selectively electrically connect and disconnect the impedance matching circuit to and from the reception circuit. The second switch is arranged to selectively electrically connect and disconnect the antenna to and from the reception circuit. When the first switch electrically connects the impedance matching circuit to the reception circuit and the second switch electrically disconnects the antenna from the reception circuit so that the predetermined signal received by the antenna is input to the frequency conversion circuit of the reception circuit via the impedance matching circuit and the first switch, the signal processor processes the frequency-converted signal output from the frequency conversion circuit. When the first switch electrically disconnects the impedance matching circuit from the reception circuit and the second switch electrically connects the antenna to the reception circuit so that the frequency signal received by the antenna is applied to the impedance matching circuit, the controller controls the impedance of the impedance matching circuit so as to bring the RSSI voltage output from the signal strength detection circuit of the reception circuit into agreement with a reference RSSI voltage.

With the above configuration, the second wireless communication apparatus can selectively operate in either a tuning mode or a reception mode. In the tuning mode, the first switch electrically disconnects the impedance matching circuit from the reception circuit and the second switch electrically connects the antenna to the reception circuit so that the frequency signal received by the antenna is applied to the impedance matching circuit; the controller controls the impedance of the impedance matching circuit to bring the RSSI voltage output from the signal strength detection circuit into agreement with the reference RSSI voltage, thereby bringing the resonance frequency of the antenna into agreement with the reference frequency. In the reception mode, the first switch electrically connects the impedance matching circuit to the reception circuit and the second switch electrically disconnects the antenna from the reception circuit so that the predetermined signal received by the antenna is input to the frequency conversion circuit of the reception circuit via the impedance matching circuit and the first switch; the signal processor performs various tasks by processing the frequency-converted signal output from the frequency conversion circuit of the reception circuit.

Consequently, when the impedance of the antenna is changed due to a change in arrangement of metal members around the antenna and the resonance frequency of the antenna is deviated from the reference frequency due to the change in the impedance, it is possible for the controller to bring the resonance frequency of the antenna back into agreement with the reference frequency by controlling the impedance of the impedance matching circuit. As a result, the receiver sensitivity of the second wireless communication apparatus to the predetermined signal transmitted by the external transmitter can be maximized despite the change in arrangement of metal members around the antenna.

Moreover, since the single oscillator is used for both the frequency conversion by the frequency conversion circuit in the reception mode and the recovery of the resonance frequency of the antenna to the reference frequency in the tuning mode, it is possible to reduce both the parts count and size of the second wireless communication apparatus.

Furthermore, in the second wireless communication apparatus, the single antenna is employed as a common antenna for receiving both the predetermined signal transmitted by the external transmitter and the frequency signal output from the oscillator. Consequently, it is possible to further reduce both the parts count and size of the second wireless communication apparatus.

BRIEF DESCRIPTION OF THE DRAWINGS

The present invention will be understood more fully from the detailed description given hereinafter and from the accompanying drawings of one preferred embodiment of the invention, which, however, should not be taken to limit the invention to the specific embodiment but are for the purpose of explanation and understanding only.

In the accompanying drawings.

DESCRIPTION OF PREFERRED EMBODIMENT

Figure 1:
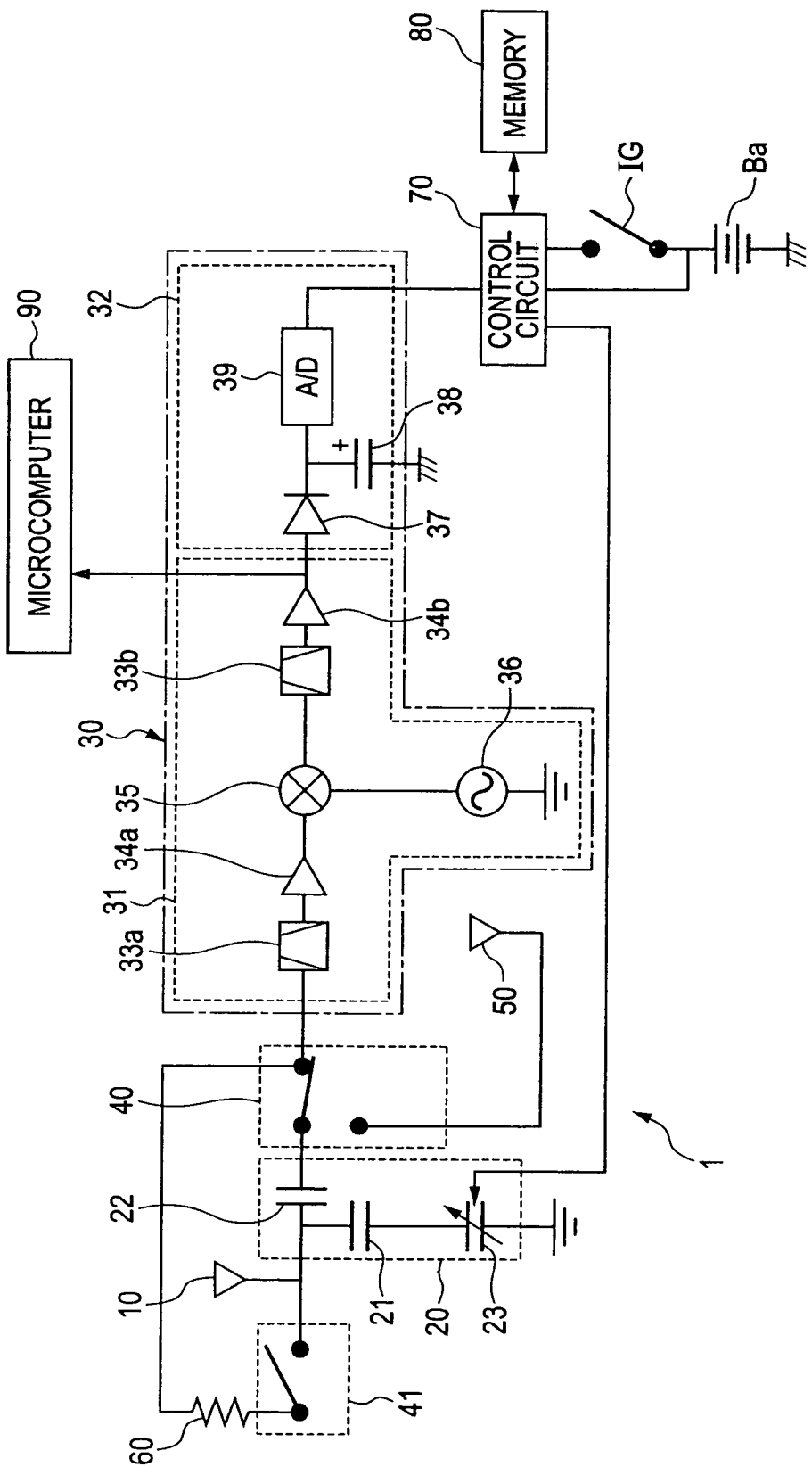
FIG. 1 is a schematic circuit diagram of a wireless communication apparatus according to a preferred embodiment of the invention, wherein the apparatus is in a reception mode.

FIG. 1 shows the overall configuration of a wireless communication apparatus 1 according to a preferred embodiment of the invention.

The wireless communication apparatus 1 according to the embodiment may be employed, for example, as a receiver in a Smart Entry System to receive predetermined signals transmitted by a portable transmitter (not shown) of the system. The Smart Entry System is a remote keyless entry system for a motor vehicle, which has been developed by Toyota Motor Corporation. Further, the wireless communication apparatus 1 may be arranged, for example, in the vicinity of a C-pillar of the vehicle. In addition, the wireless communication apparatus 1 is designed so as to be capable of being used in different types of motor vehicles.

As shown in FIG. 1, the wireless communication apparatus 1 includes a first antenna 10, an impedance matching circuit 20, a reception circuit 30, first and second switches 40 and 41, a second antenna 50, a resistor element 60, a control circuit 70, a memory 80 and a microcomputer 90.

The first antenna 10 is provided for receiving the predetermined signals that are transmitted by the portable transmitter at a reference frequency. Here, the reference frequency denotes the frequency of carrier waves used in the signal transmission by the portable transmitter.

The impedance matching circuit 20 performs impedance matching between the first antenna 10 and the reception circuit 30. In other words, the impedance matching circuit 20 functions to match the impedance of the antenna 10 with the impedance of the reception circuit 30. The impedance matching circuit 20 includes fixed-capacitance capacitors 21 and 22 and a variable-capacitance capacitor 23. The capacitor 21 has one electrode electrically connected to the first antenna 10 and the other electrode electrically connected to one electrode of the capacitor 23. The other electrode of the capacitor 23 is grounded. In other words, the capacitors 21 and 23 are serially connected between the first antenna 10 and ground. On the other hand, the capacitor 22 has one electrode electrically connected to the first antenna 10 and the other electrode electrically connected to the reception circuit 30 via the first switch 40.

In the present embodiment, the reception circuit 30 is configured as a superheterodyne-type reception circuit. The reception circuit 30 converts signals input from the first antenna 10 or the impedance matching circuit 20, by mixing those signals with a frequency signal having a frequency different from the reference frequency, into signals that have a lower frequency than the respective original signals. In addition, in the present embodiment, the reception circuit 30 is implemented by an Integrated Circuit (IC).

Specifically, the reception circuit 30 includes a frequency conversion circuit 31 and a voltage detection circuit 32.

The frequency conversion circuit 31 includes filters 33a and 33b, voltage amplifiers 34a and 34b, a mixer 35 and an oscillator 36. The filter 33a is implemented by a band-pass filter that passes only those components of the signals input from the first antenna 10 or the impedance matching circuit 20 which fall within a predetermined frequency range. The voltage amplifier 34a amplifies the voltages of the signals output from the filter 33a. The mixer 35 is configured as a multiplier that multiplies the signals output from the voltage amplifier 34a by the frequency signal output from the oscillator 36. That is, the mixer 35 converts the signals output from the voltage amplifier 34a, by mixing those signals with the frequency signal output from the oscillator 36, into signals that have a lower frequency than the respective original signals. The oscillator 36 oscillates at a predetermined frequency, thereby outputting the frequency signal which has the predetermined frequency. In addition, in the present embodiment, the predetermined frequency is set to be higher than the reference frequency of the predetermined signals transmitted by the portable transmitter. The filter 33b is also implemented by a band-pass filter that passes only those components of the signals output from the mixer 35 which fall within a predetermined frequency range. The voltage amplifier 34b amplifies the voltages of the signals output from the filter 33b.

The signal strength detection circuit 32 detects the strength of the frequency-converted signals output from the frequency conversion circuit 31 and outputs a digital signal indicative of the detected strength. The signal strength detection circuit 32 includes a diode 37, a capacitor 38 and an A/D converter 39. The diode 37 has its anode electrically connected to the voltage amplifier 34b of the frequency conversion circuit 31 and its cathode electrically connected to the A/D converter 39. The diode 37 half-wave rectifies the signals output from the voltage amplifier 34b. The capacitor 38 has its positive electrode electrically connected to the cathode of the diode 37 and its negative electrode grounded. The capacitor 38 is provided for forming an integration circuit that integrates and thereby smoothes the output voltage of the diode 37. In addition, the voltage across the positive and negative electrodes of the capacitor 38 indicates the strength of the signals output from the frequency conversion circuit 31 to the reception circuit 30. The A/D converter 39 converts the voltage across the positive and negative electrodes of the capacitor 38 into a digital signal and outputs the obtained digital signal. The digital signal indicates a Received Signal Strength Indication (RSSI) voltage that represents the strength of the signals output from the frequency conversion circuit 31 to the reception circuit 30.

The first switch 40 is arranged to selectively electrically connect one of the second antenna 50 and the filter 33a of the frequency conversion circuit 31 of the reception circuit 30 to the impedance matching circuit 20 while disconnecting the other from the impedance matching circuit 20. The second switch 41 is arranged between the first antenna 10 and the reception circuit 30 to selectively electrically connect and disconnect them.

The second antenna 50 is provided in the vicinity of the reception circuit 30 to receive, as a radio wave, the frequency signal output from the oscillator 36 of the reception circuit 30.

Figure 2:
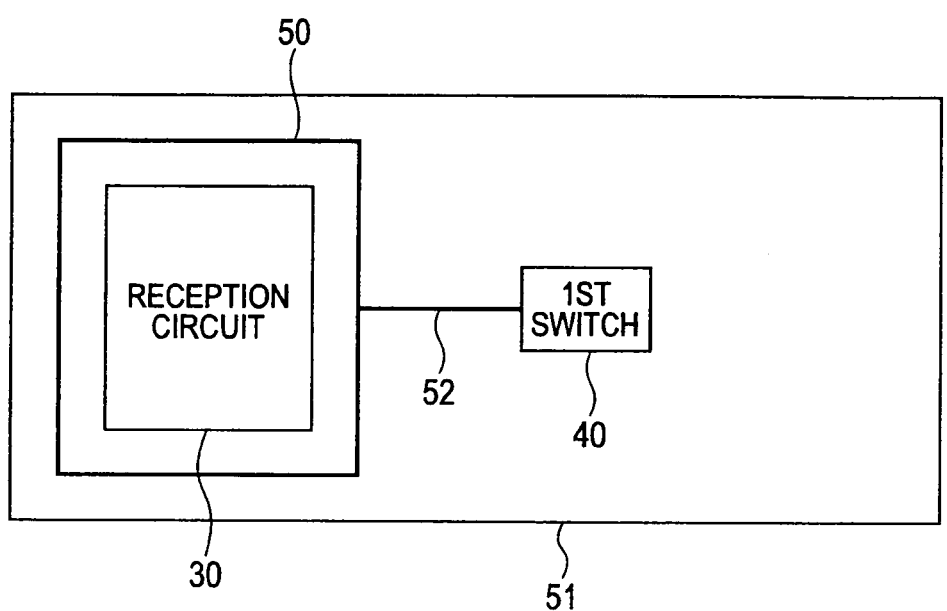
FIG. 2 is a schematic view illustrating the formation of a second antenna of the wireless communication apparatus on a circuit board.

Referring to FIG. 2, in the present embodiment, the second antenna 50 is implemented by a pattern formed on a circuit board 51. On the circuit board 51, there are also provided other electronic components of the wireless communication apparatus 1 including the reception circuit 30 and the first switch 40. The pattern is made of an electrically conductive material, such as copper, and formed as a thin film on an insulating layer of the circuit board 51. Moreover, in the present embodiment, the second antenna 50 is formed on the circuit board 51 as a loop antenna (magnetic antenna) that encloses the entire reception circuit 30. Further, the second antenna 50 may be formed to have the shape of a square frame each side of which is, for example, 10 mm long. In addition, it should be noted that FIG. 2 illustrates only the reception circuit 30 and the second antenna 50, which is electrically connected to the first switch 40 via a pattern 52, omitting all the other electronic components which are also provided on the circuit board 51.

Referring back to FIG. 1, the resistor element 60 is electrically connected in series with the second switch 41 between the first antenna 10 and the reception circuit 30. The resistor element 60 has an extremely high resistance so that only limited current can flow from the first antenna 10 to the reception circuit 30 via the resistor element 60. In other words, the resistor element 60 functions as a current limiter to limit the current flowing from the first antenna 10 to the reception circuit 30 via the second switch 41.

The control circuit 70 is configured with a microcomputer and powered by a battery Ba. As will be described in detail later, the control circuit 70 controls the impedance matching circuit 20 and the first and second switches 40 and 41 based on the output signals of the A/D converter 39 and an ignition switch IG of the vehicle.

The memory 80 stores therein computer programs to be executed by the control circuit 70 as well as the values of parameters V0 and C0 which will be described in detail later.

The microcomputer 90 performs various tasks by processing the frequency-converted signals output from the frequency conversion circuit 31 of the reception circuit 30; the tasks include, for example, identification of the vehicle ID and determination of the strength of the predetermined signals input to the reception circuit 30. In other words, the microcomputer 90 functions as a signal processor to process the frequency-converted signals output from the frequency conversion circuit 31. In addition, the predetermined signals input to the reception circuit 30 indicate the vehicle ID code.

After having described the overall configuration of the wireless communication apparatus 1 according to the present embodiment, operation thereof will be described hereinafter.

When the resonance frequency of the first antenna 10 is equal to the reference frequency of the predetermined signals transmitted by the portable transmitter, the receiver sensitivity of the wireless communication apparatus 1 to the predetermined signals becomes highest.

However, when there is a change in arrangement of metal members around the first antenna 10, the change will cause the impedance of the first antenna 10 to accordingly change; further, the change in the impedance will cause the resonance frequency of the first antenna 10 to deviate from the reference frequency.

More specifically, metal members arranged in the vicinity of the first antenna 10, such as the vehicle body and frame, influence the impedance of the first antenna 10. Moreover, as described previously, the wireless communication apparatus 1 is designed so as to be capable of being used in different types of motor vehicles. However, different types of motor vehicles have different arrangements of metal members around the first antenna 10; therefore, the impedance of the first antenna 10 has different values in different types of motor vehicles.

In view of the above, in the present embodiment, after the wireless communication apparatus 1 is mounted on the vehicle, the control circuit 70 controls the impedance matching circuit 20 so as to ensure that the resonance frequency of the first antenna 10 is equal to the reference frequency of the predetermined signals.

Figure 3:
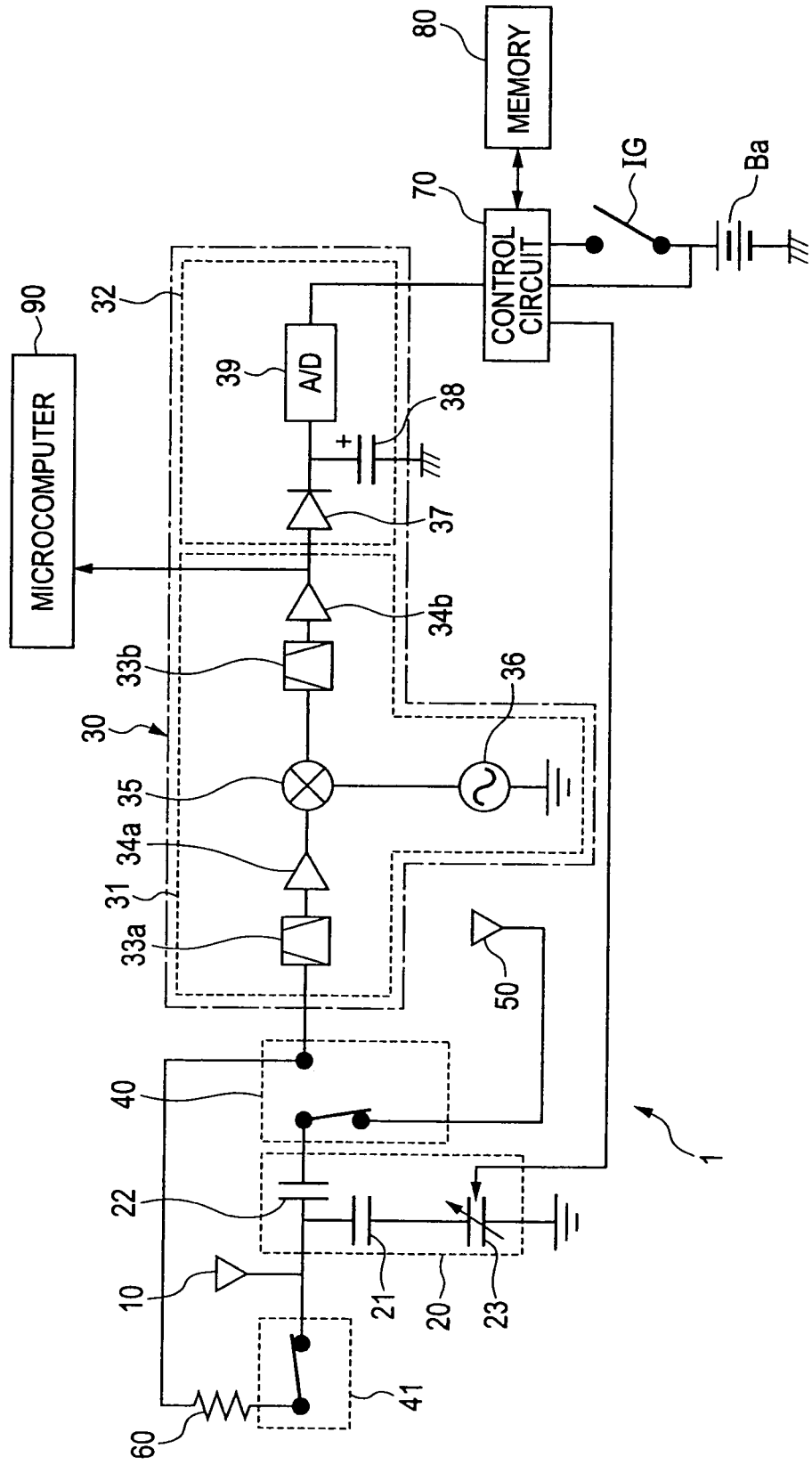
FIG. 3 is a schematic circuit diagram of the wireless communication apparatus when the apparatus is in a tuning mode.

Specifically, referring to FIG. 3, when the impedance matching circuit 20 is electrically connected to the second antenna 50 by the first switch 40 and the first antenna 10 is electrically connected to the reception circuit 30 by the second switch 41, the frequency signal output by the oscillator 36 and received by the second antenna 50 will be applied to the impedance matching circuit 20.

Figure 4:
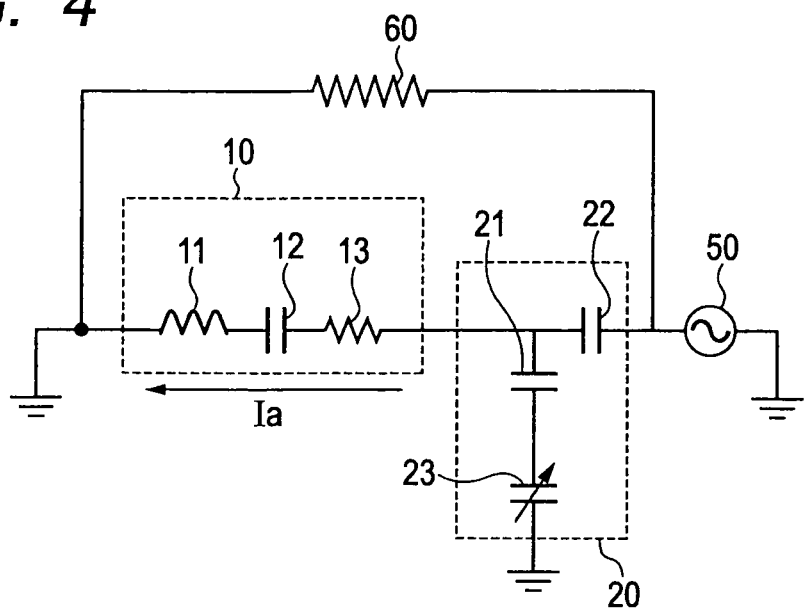
FIG. 4 is a schematic circuit diagram illustrating an equivalent circuit of the wireless communication apparatus when the apparatus is in the tuning mode.

FIG. 4 shows an equivalent circuit of the wireless communication apparatus 1 when the first and second switches 40 and 41 are operated as shown in FIG. 3.

In FIG. 4, the first antenna 10 is equivalently represented by an inductor 11, a capacitor 12 and a resistor element 13, which are electrically connected in series with one another. Moreover, the first antenna 10 is electrically connected between the impedance matching circuit 20 and ground. On the other hand, the second antenna 50 is equivalently represented by an oscillator that outputs the frequency signal to the impedance matching circuit 20. The second antenna 50 is electrically connected between the impedance matching circuit 20 and ground on the opposite side to the first antenna 10.

The resistor element 60 has, as described previously, an extremely high resistance. Therefore, the impedance of the resistor element 60 is considerably higher than the individual impedances of the filter 33a, the amplifier 34a and the mixer 35 of the frequency conversion circuit 31 of the reception circuit 30. As a result, only small (or limited) current can flow from the first antenna 10 to the frequency conversion circuit 31 of the reception circuit 30. Accordingly, the influence of the impedances of the filter 33a, the amplifier 34a and the mixer 35 on the operation of the first antenna 10 and the impedance matching circuit 20 is negligible. Therefore, the filter 33a, the amplifier 34a and the mixer 35 are omitted from the equivalent circuit shown in FIG. 4. In addition, the first and second switches 40 and 41 are also omitted from the equivalent circuit for the sake of convenience.

Figure 5:
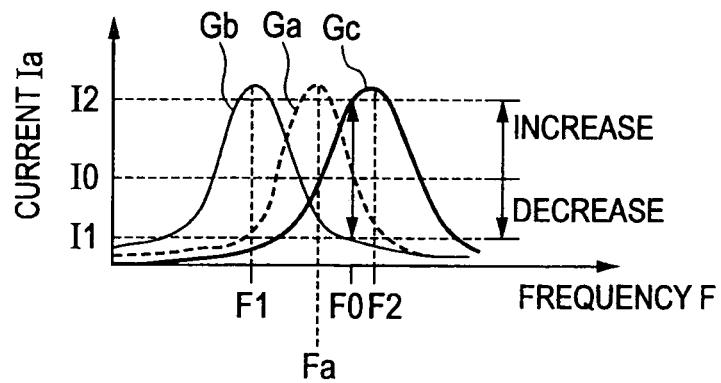
FIG. 5 is a graphical representation illustrating the relationship between current flowing through a first antenna and the frequency of a frequency signal output by an oscillator when the wireless communication apparatus operates in the tuning mode.

FIG. 5 shows the relationship between the current Ia flowing through the first antenna 10 and the frequency F of the frequency signal applied to the impedance matching circuit 20 via the second antenna 50.

In FIG. 5, the curve Ga indicates the change in the current Ia with the frequency F when the resonance frequency of the first antenna 10 is equal to the reference frequency Fa of the predetermined signals. The curve Gb indicates the change in the current Ia with the frequency F when the resonance frequency of the first antenna 10 is equal to F1 which is lower than Fa. The curve Gc indicates the change in the current Ia with the frequency F when the resonance frequency of the first antenna 10 is equal to F2 that is higher than Fa.

Suppose that the oscillator 36 outputs the frequency signal at a predetermined (or fixed) frequency of F0. Then, in the equivalent circuit shown in FIG. 4, the first antenna 10, the impedance matching circuit 20 and the second antenna 50 together form a resonance circuit that resonates at F0.

Further, suppose that the current Ia flowing through the first antenna 10 is equal to I0 when the resonance frequency of the first antenna 10 is equal to the reference frequency Fa. Then, when the resonance frequency of the first antenna 10 is decreased from Fa to F1 due to a change in arrangement of metal members around the first antenna 10, the current Ia flowing through the first antenna 10 will be accordingly decreased from I0 to I1. Consequently, the voltage VR across the terminals of the resistor element 60 will be accordingly decreased as shown in FIG. 6.

Figure 6:
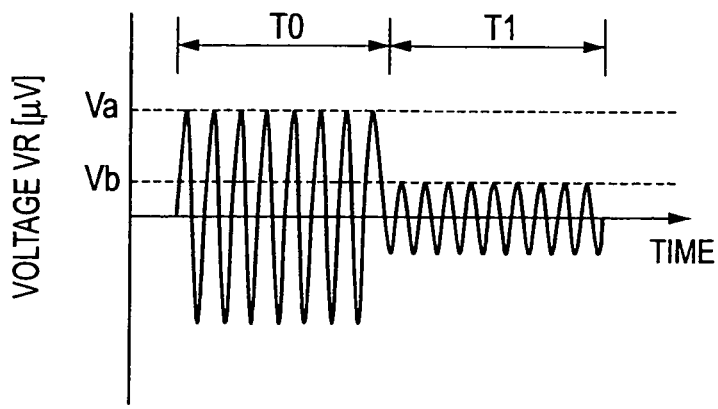
FIG. 6 is a time chart illustrating the change in voltage across the terminals of a resistor element of the wireless communication apparatus.

FIG. 6 shows the change in the voltage VR with time. In FIG. 6, T0 indicates a time period in which the resonance frequency of the first antenna 10 is equal to the reference frequency Fa; T1 indicates a time period in which the resonance frequency of the first antenna 10 is equal to F1. As seen from the FIG. 6, with the decrease in the resonance frequency of the first antenna 10 from Fa to F1, the voltage VR across the terminals of the resistor element 60 will be decreased from Va to Vb.

Furthermore, with the decrease in the current Ia from I0 to I1, the strength of the signal output from the first antenna 10 to the reception circuit 30 via the resistor element 60 will be accordingly weakened.

In addition, referring again to FIG. 3, in the reception circuit 30, the signal output from the first antenna 10 to the reception circuit 30 via the resistor element 60 is filtered by the filter 33a, amplified in voltage by the voltage amplifier 34a, and frequency-converted by the mixer 35. Then, the signal output from the mixer 35 is further filtered by the filter 33b, amplified in voltage by the voltage amplifier 34b, rectified by the diode 37, smoothed by the capacitor 38, and converted to the digital signal by the A/D converter 39. As described previously, the digital signal output from the A/D converter 39 indicates the RSSI voltage that represents the strength of the signal input to the reception circuit 30.

Figure 7:
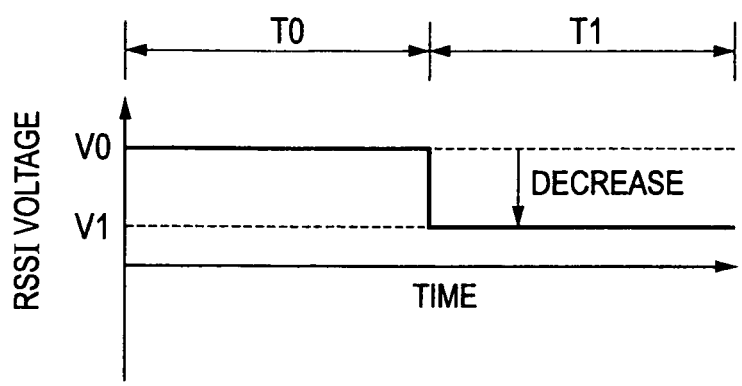
FIG. 7 is a time chart illustrating the change in an RSSI voltage output from a signal strength detection circuit of the wireless communication apparatus.

Consequently, with the strength of the signal output from the first antenna 10 to the reception circuit 30 via the resistor element 60 being attenuated as described above, the RSSI voltage indicated by the digital signal output from the A/D converter 39 will be accordingly decreased from V0 to V1, as shown in FIG. 7.

On the other hand, referring back to FIG. 5, when the resonance frequency of the first antenna 10 is increased from Fa to F2 due to a change in arrangement of metal members around the first antenna 10, the current Ia flowing through the first antenna 10 will be accordingly increased from I0 to I2. Consequently, the voltage VR across the terminals of the resistor element 60 will be accordingly increased.

Furthermore, with the increase in the current Ia from I0 to I2, the strength of the signal output from the first antenna 10 to the reception circuit 30 via the resistor element 60 will be accordingly increased. Consequently, the RSSI voltage indicated by the digital signal output from the A/D converter 39 will be also accordingly increased.

As above, the RSSI voltage indicated by the digital signal output from the A/D converter 39 changes with the resonance frequency of the first antenna 10. Moreover, the resonance frequency of the first antenna 10 depends on both the impedances of the first antenna 10 and the impedance matching circuit 20.

Therefore, in the present embodiment, the RSSI voltage indicated by the digital signal output from the A/D converter 39 is first recorded when: the first and second switches 40 and 41 are operated as shown in FIG. 3; there are no metal members arranged in the vicinity of the first antenna 10; and the resonance frequency of the first antenna 10 is equal to the reference frequency Fa. Then, the recorded RSSI voltage is stored in the memory 80 as a reference RSSI voltage V0. In addition, at this stage, the capacitance of the variable-capacitance capacitor 23 of the impedance matching circuit 20 is also recorded and stored in the memory 80 as an initial capacitance C0.

Thereafter, in controlling the impedance matching circuit 20, the control circuit 70 first determines whether the RSSI voltage indicated by the digital signal output from the A/D converter 39 is equal to V0. If not, the control circuit 70 varies the capacitance of the variable-capacitance capacitor 23 of the impedance matching circuit 20 until the RSSI voltage becomes equal to V0. Consequently, by bringing the RSSI voltage into agreement with V0, it is possible to brining the resonance frequency of the first antenna 10 back into agreement with the reference frequency Fa (i.e., make the resonance frequency again equal to the reference frequency Fa).

Figure 8:
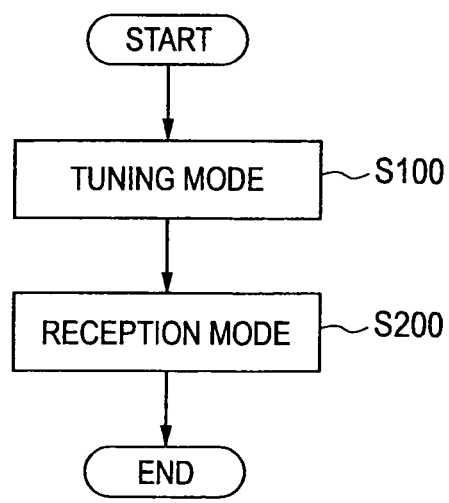
FIG. 8 is a flow chart illustrating operation of the wireless communication apparatus.

FIG. 8 is a flow chart illustrating the operation of the wireless communication apparatus 1 according to the present embodiment.

As shown in FIG. 8, upon turning on the ignition switch IG of the vehicle, the wireless communication apparatus 1 first operates in a tuning mode, as indicated at step S100.

In the tuning mode, the control circuit 70 operates the first switch 40 to electrically connect the impedance matching circuit 20 to the second antenna 50 and the second switch 41 to electrically connect the first antenna 10 to the reception circuit 30, as shown in FIG. 3. Consequently, the frequency signal output by the oscillator 36 and received by the second antenna 50 is applied to the impedance matching circuit 20. Then, the signal sent from the first antenna 10 to the reception circuit 30 via the resistor element 60 is processed by the reception circuit 30, resulting in the digital signal output from the A/D converter 39. As described previously, the digital signal indicates the RSSI voltage that represents the strength of the signal input to the reception circuit 30.

Figure 9:
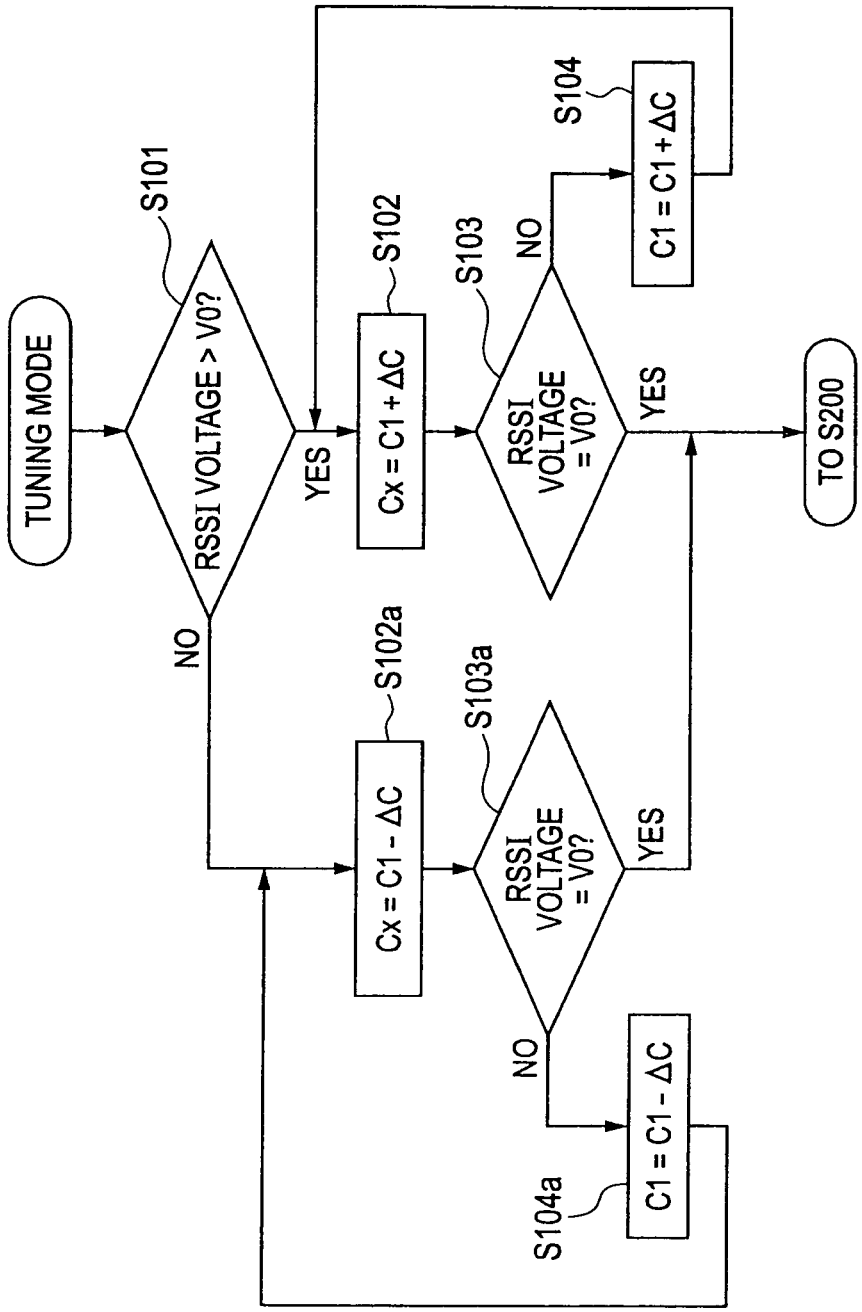
FIG. 9 is a flow chart illustrating a tuning process of a control circuit of the wireless communication apparatus.

Further, based on the digital signal output from the A/D converter 39, the control circuit 70 performs a tuning process as shown in FIG. 9, so as to ensure that the resonance frequency of the first antenna 10 is equal to the reference frequency Fa.

Specifically, at step S101, the control circuit 70 determines whether the RSSI voltage indicated by the digital signal output from the A/D converter 39 is higher than the reference RSSI voltage V0. In other words, the control circuit 70 determines whether the resonance frequency of the first antenna 10 is higher than the reference frequency Fa.

Figure 10:
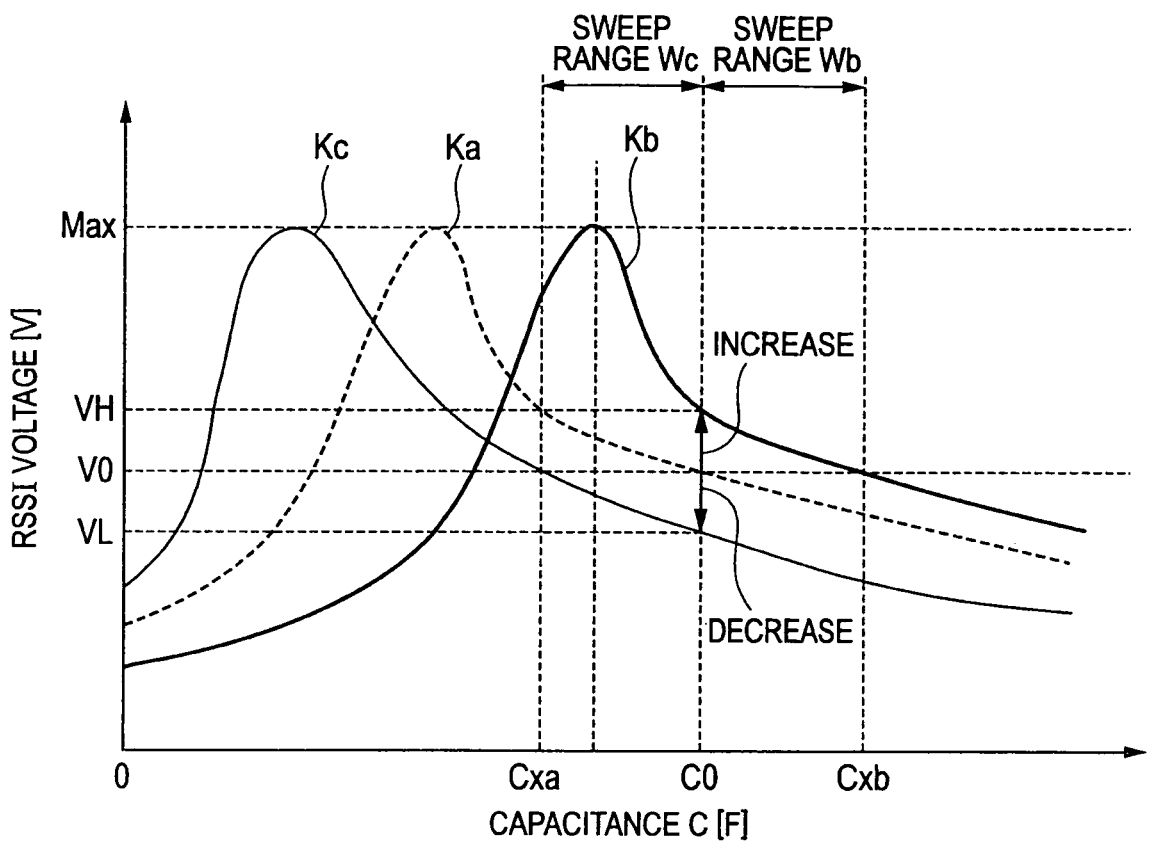
FIG. 10 is a graphical representation illustrating the relationship between the RSSI voltage and the capacitance of a variable-capacitance capacitor in the wireless communication apparatus.

FIG. 10 shows the relationship between the RSSI voltage indicated by the digital signal output from the A/D converter 39 and the capacitance of the variable-capacitance capacitor 23 of the impedance matching circuit 20. In FIG. 10, the curve Ka indicates the change in the RSSI voltage with the capacitance when the resonance frequency of the first antenna 10 is equal to the reference frequency Fa. The curve Kb indicates the change in the RSSI voltage with the capacitance when the resonance frequency of the first antenna 10 is higher than the reference frequency Fa. The curve Kc indicates the change in the RSSI voltage with the capacitance when the resonance frequency of the first antenna 10 is lower than the reference frequency Fa.

As seen from FIG. 10, when the resonance frequency of the first antenna 10 becomes higher than the reference frequency Fa with the capacitance of the variable-capacitance capacitor 23 set to the initial capacitance C0, the RSSI voltage is accordingly increased from the reference RSSI voltage V0 to VH that is higher than V0. On the other hand, when the resonance frequency of the first antenna 10 becomes lower than the reference frequency Fa with the capacitance of the variable-capacitance capacitor 23 set to C0, the RSSI voltage is accordingly decreased from the reference RSSI voltage V0 to VL that is lower than V0.

Moreover, referring back to FIG. 4, for the sake of convenience of explanation, it is possible to consider the first antenna 10 simply as the inductor 11 (i.e., neglect the capacitor 12 and the resistor element 13) and the impedance matching circuit 20 simply as the variable-capacitance capacitor 23 (i.e., neglect the fixed-capacitance capacitors 21 and 22). Then, the resonance frequency f of the first antenna 10 can be determined by the following equation:

$$f = 1/\{2\pi(L \times C)^{1/2}\} \qquad (1)$$

where L is the inductance of the inductor 11 and C is the capacitance of the variable-capacitance capacitor 23.

It can be seen from the equation (1) that the resonance frequency f of the first antenna 10 depends on the capacitance C of the variable-capacitance capacitor 23. More specifically, the resonance frequency f decreases with increase in the capacitance C. Therefore, it is possible to increase the resonance frequency f by decreasing the capacitance C and in contrast to decrease f by increasing C. Furthermore, when the resonance frequency f is deviated from the reference frequency Fa, it is possible to bring f back into agreement with Fa by varying (i.e., increasing or decreasing) the capacitance C.

In view of the above, returning to FIG. 9, in the tuning process according to the present embodiment, if the determination at step S101 produces a "YES" answer, then the process proceeds to step S102.

At step S102, the control circuit 70 first computes an intermediate variable Cx by the following equation:

$$Cx = C1 + \Delta C \qquad (2)$$

where C1 is initially set to C0 (i.e., the initial capacitance of the variable-capacitance capacitor 23) and ΔC is a predetermined value.

Then, the control circuit 70 sets the capacitance C of the variable-capacitance capacitor 23 to Cx.

At step S103, the control circuit 70 determines whether the RSSI voltage indicated by the digital signal output from the A/D converter 39 becomes equal to the reference RSSI voltage V0.

If the determination at step S103 produces a "YES" answer, in other words, if the resonance frequency f of the first antenna 10 becomes equal to the reference frequency Fa, then the process is terminated to proceed to step S200 of FIG. 8.

Otherwise, if the determination at step S103 produces a "NO" answer, in other words, if the resonance frequency f of the first antenna 10 is still different from the reference frequency Fa, then the process goes on to step S104.

At step S104, C1 is incremented by ΔC. Thereafter, the process returns to repeat steps S102-S104 until the RSSI voltage becomes equal to V0.

Consequently, referring to again FIG. 10, when the RSSI voltage becomes equal to V0, in other words, when the resonance frequency f of the first antenna 10 becomes equal to the reference frequency Fa, the capacitance C of the variable-capacitance capacitor 23 becomes equal to Cxb that is higher than the initial value C0. In addition, by repeating steps S102-S104 of FIG. 9, the capacitance C of the variable-capacitance capacitor 23 is gradually increased from C0 to Cxb within a first sweep range Wb as shown in FIG. 10.

Referring back to FIG. 9, if the determination at step S101 produces a "NO" answer, in other words, if the resonance frequency f of the first antenna 10 is lower than the reference frequency Fa, then the process proceeds to step S102a.

At step S102a, the control circuit 70 first computes the intermediate variable Cx by the following equation:

$$Cx = C1 - \Delta C \qquad (3)$$

where C1 is initially set to C0 and ΔC is the predetermined value.

Then, the control circuit 70 sets the capacitance C of the variable-capacitance capacitor 23 to Cx.

At step S103a, the control circuit 70 determines whether the RSSI voltage indicated by the digital signal output from the A/D converter 39 becomes equal to the reference RSSI voltage V0.

If the determination at step S103a produces a "YES" answer, in other words, if the resonance frequency f of the first antenna 10 becomes equal to the reference frequency Fa, then the process is terminated to proceed to step S200 of FIG. 8.

Otherwise, if the determination at step S103a produces a "NO" answer, in other words, if the resonance frequency f of the first antenna 10 is still different from the reference frequency Fa, then the process goes on to step S104a.

At step S104a, C1 is decremented by ΔC. Thereafter, the process returns to repeat steps S102a-S104a until the RSSI voltage becomes equal to V0.

Consequently, referring again to FIG. 10, when the RSSI voltage becomes equal to V0, in other words, when the resonance frequency f of the first antenna 10 becomes equal to the reference frequency Fa, the capacitance C of the variable-capacitance capacitor 23 becomes equal to Cxa that is lower than the initial value C0. In addition, by repeating steps S102a-S104a of FIG. 9, the capacitance C of the variable-capacitance capacitor 23 is gradually decreased from C0 to Cxa within a second sweep range We as shown in FIG. 10.

Turning back to FIG. 8, after completion of the tuning process by the control circuit 70, the operation of the wireless communication apparatus 1 enters a reception mode, as indicated at step S200.

In the reception mode, the control circuit 70 operates the first switch 40 to electrically connect the impedance matching circuit 20 to the reception circuit 30 and the second switch 41 to electrically disconnect the first antenna 10 from the reception circuit 30, as shown in FIG. 1. Consequently, the predetermined signals transmitted by the portable transmitter and received by the first antenna 10 are input to the reception circuit 30 via the impedance matching circuit 20 and the first switch 40, and then frequency-converted by the frequency conversion circuit 31 of the reception circuit 30. Thereafter, the microcomputer 90 performs various tasks by processing the frequency-converted signals output from the frequency conversion circuit 31.

The above-described wireless communication apparatus 1 according to the present embodiment has the following advantages.

In the present embodiment, the wireless communication apparatus 1 includes the first and second antennas 10 and 50, the impedance matching circuit 20, the reception circuit 30, the first and second switches 40 and 41, the control circuit 70 and the microcomputer 90. The first antenna 10 is provided for receiving the predetermined signals that are transmitted by the portable transmitter (i.e., an external transmitter to the apparatus 1) at the reference frequency Fa. The impedance matching circuit 20 performs impedance matching between the first antenna 10 and the reception circuit 30. The impedance matching circuit 20 has the variable-capacitance capacitor 23 so that the impedance of the circuit 20 can be varied by varying the capacitance of the capacitor 23. In other words, the impedance matching circuit 20 has a variable impedance. The reception circuit 30 includes the frequency conversion circuit 31 and the signal strength detection circuit 32. The frequency conversion circuit 31 includes the oscillator 36 that outputs the frequency signal at the predetermined frequency F0 which is higher than the reference frequency Fa. The frequency conversion circuit 31 is configured to frequency-convert the signals input to the reception circuit 30 based on the frequency signal output from the oscillator 36. The signal strength detection circuit 32 is configured to detect the strength of the frequency-converted signals output from the frequency conversion circuit 31 and output the RSSI voltage that represents the detected strength. More particularly, in the present embodiment, the signal strength detection circuit 32 includes the A/D converter 39 that outputs the digital signal indicating the RSSI voltage. The second antenna 50 is provided for receiving the frequency signal output from the oscillator 36 of the frequency conversion circuit 31 of the reception circuit 30. The first switch 40 is arranged to selectively electrically connect one of the second antenna 50 and the reception circuit 30 to the impedance matching circuit 20 while disconnecting the other from the impedance matching circuit 20. The second switch 41 is arranged to selectively electrically connect and disconnect the first antenna 10 to and from the reception circuit 30. The microcomputer 90 functions as a signal processor to process the predetermined signals which are received by the first antenna 10, input to the frequency conversion circuit 31 of the reception circuit 30 via the impedance matching circuit 20 and the first switch 40, and frequency-converted by and output from the frequency conversion circuit 31. The control circuit 70 controls the impedance of the impedance matching circuit 20 (more particularly, the capacitance of the variable-capacitance capacitor 23) so as to bring the RSSI voltage output from the signal strength detection circuit 32 of the reception circuit 30 into agreement with the reference RSSI voltage V0.

With the above configuration, the wireless communication apparatus 1 can selectively operate in either the tuning mode or the reception mode. In the tuning mode, the first switch 40 electrically connects the second antenna 50 to the impedance matching circuit 20 and the second switch 41 electrically connects the first antenna 10 to the reception circuit 30 so that the frequency signal received by the second antenna 50 is applied to the impedance matching circuit 20; the control circuit 70 controls the impedance of the impedance matching circuit 20 to bring the RSSI voltage output from the signal strength detection circuit 32 into agreement with the reference RSSI voltage V0, thereby bringing the resonance frequency f of the first antenna 10 into agreement with the reference frequency Fa. In the reception mode, the first switch 40 electrically connects the reception circuit 30 to the impedance matching circuit 20 and the second switch 41 electrically disconnects the first antenna 10 from the reception circuit 30 so that the predetermined signals received by the first antenna 10 is input to the frequency conversion circuit 31 of the reception circuit 30 via the impedance matching circuit 20 and the first switch 40; the microcomputer 90 performs various tasks, such as identification of the vehicle ID, by further processing the frequency-converted signals output from the frequency conversion circuit 31 of the reception circuit 30.

Consequently, when the impedance of the first antenna 10 is changed due to a change in arrangement of metal members around the first antenna 10 and the resonance frequency of the first antenna 10 is deviated from the reference frequency Fa due to the change in the impedance, it is possible for the control circuit 70 to bring the resonance frequency of the first antenna 10 back into agreement with the reference frequency Fa by controlling the impedance of the impedance matching circuit 20. As a result, the receiver sensitivity of the wireless communication apparatus 1 to the predetermined signals transmitted by the portable transmitter can be maximized despite the change in arrangement of metal members around the first antenna 10.

Moreover, since the single oscillator 36 is used for both the frequency conversion by the frequency conversion circuit 31 in the reception mode and the recovery of the resonance frequency of the first antenna 10 to the reference frequency Fa in the tuning mode, it is possible to reduce both the parts count and size of the wireless communication apparatus 1.

Furthermore, in the present embodiment, the reception circuit 30 is implemented by an IC and the frequency signal output from the oscillator 36 of the reception circuit 30 is wirelessly applied to the impedance matching circuit 20 via the second antenna 50. That is, it is unnecessary to wire between the IC and the impedance matching circuit 20 and thus unnecessary to modify the IC.

In the present embodiment, the reception circuit 30 is provided on the circuit board 51, and the second antenna 50 is implemented by the pattern formed on the circuit board 51.

With the above formation, it is possible to easily provide the second antenna 50 in the vicinity of the oscillator 36 of the reception circuit 30. Consequently, it is possible for the second antenna 50 to reliably receive the frequency signal output from the oscillator 36.

Further, in the present embodiment, the pattern making up the second antenna 50 is formed on the circuit board 51 so as to enclose the entire reception circuit 30.

Figure 11:
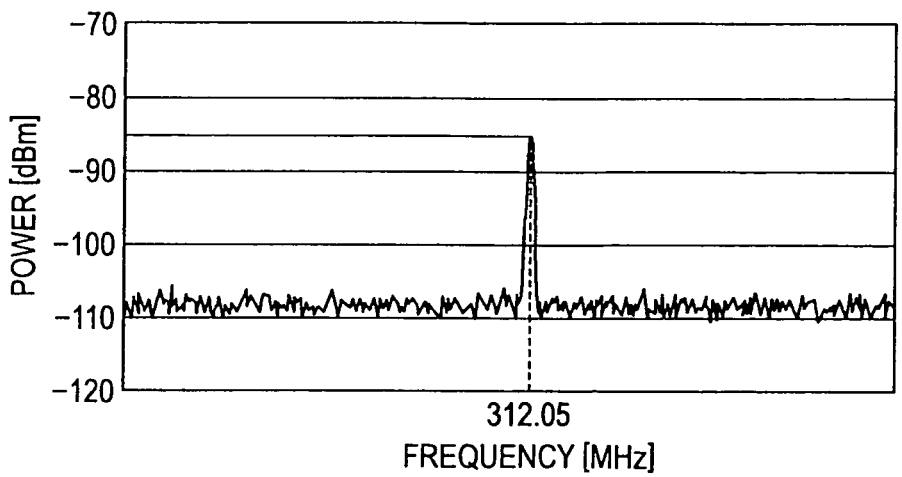
FIG. 11 is a graph illustrating the relationship between the power of the frequency signal received by the second antenna and the frequency of the frequency signal.

With the above formation, it is possible to secure a sufficiently large size of the second antenna 50 while positioning the second antenna 50 sufficiently close to the oscillator 36. Consequently, it is possible to secure a sufficiently high strength of the frequency signal received by the second antenna 50. For example, as shown in FIG. 11, when the predetermined frequency F0 of the frequency signal is equal to 312.05 MHz, the power conveyed by the frequency signal to the second antenna 50 reaches its maximum.

In the present embodiment, the impedance matching circuit 20 includes the variable-capacitance capacitor 23. The control circuit 70 controls the impedance of the impedance matching circuit 20 by controlling the capacitance of the capacitor 23. At step S101 of the tuning process shown in FIG. 9, the control circuit 70 first determines whether the RSSI voltage output from the signal strength detection circuit 32 is higher or lower than the reference RSSI voltage V0. If the RSSI voltage is higher than V0, the control circuit 70 gradually increases the capacitance of the capacitor 23 within the first sweep range Wb until the RSSI voltage becomes equal to V0; the first sweep range Wb has its lower limit set to the initial capacitance C0 as shown in FIG. 10. On the other hand, if the RSSI voltage is lower than V0, the control circuit 70 gradually decreases the capacitance of the capacitor 23 within the second sweep range We until the RSSI voltage becomes equal to V0; the second sweep range Wb has its upper limit set to the initial capacitance C0 as shown in FIG. 10.

With the above configuration, it is possible to considerably reduce the time required for bringing the RSSI voltage into agreement with V0 compared to the case of varying the capacitance within a full possible range thereof.

In the present embodiment, between the second switch 41 and the reception circuit 30, there is electrically connected the resistor element 60 that has an extremely, high resistance.

Consequently, in the tuning mode of the wireless communication apparatus 1, only small current can flow from the first antenna 10 to the reception circuit 30 via the second switch 41. In other words, the resistor element 60 functions as a current limiter to limit the current flowing from the first antenna 10 to the reception circuit 30 in the tuning mode. As a result, the first antenna 10, the impedance matching circuit 20 and the second antenna 50 can together form a resonance circuit that resonates in response to the frequency signal output from the oscillator 36. Thus, it becomes possible to reliably cause the RSSI voltage output from the signal strength detection circuit 32 of the reception circuit 30 to change with the resonance frequency of the first antenna 10. Accordingly, it becomes possible to reliably determine whether the resonance frequency of the first antenna 10 is equal to the reference frequency Fa by determining whether the RSSI voltage is equal to the reference RSSI voltage.

In addition, in the reception mode of the wireless communication apparatus 1, the first switch 40 electrically connects the impedance matching circuit 20 to the reception circuit 30 and the second switch 41 electrically disconnects the resistor element 60 and the reception circuit 30 from the first antenna 10. Consequently, the predetermined signals received by the first antenna 10 can be reliably input to the reception circuit 30 via the impedance matching circuit 20 without being attenuated by the resistor element 60.

In the present embodiment, the predetermined frequency F0 of the frequency signal output by the oscillator 36 of the reception circuit 30 is set to be higher than the reference frequency Fa of the predetermined signals transmitted by the portable transmitter.

Setting the predetermined frequency F0 as above, in the tuning mode of the wireless communication apparatus 1, the current Ia flowing through the first antenna 10 increases with the resonance frequency of the first antenna 10. Further, the RSSI voltage output from the signal strength detection circuit 32 of the reception circuit 30 increases with the current Ia flowing through the first antenna 10. Consequently, it is possible to reliably determine whether the resonance frequency of the first antenna 10 is higher or lower than the reference frequency Fa by determining whether the RSSI voltage is higher or lower than the reference RSSI voltage.

In addition, in the present embodiment, the control circuit 70 performs once the tuning process shown in FIG. 9 each time the ignition switch IG of the vehicle is turned from off to on. Therefore, even if the resonance frequency of the first antenna 10 is deviated from the reference frequency Fa due to a change in arrangement of metal members around the first antenna 10 after the mounting of the wireless communication apparatus 1 on the vehicle, it is still possible to reliably bring the resonance frequency back into agreement with Fa in a timely manner.

While the above particular embodiment of the present invention has been shown and described, it will be understood by those skilled in the art that various modifications, changes, and improvements may be made without departing from the spirit of the invention.

For example, in the previous embodiment, the second antenna 50 is implemented by the pattern that is formed on the circuit board 51 so as to enclose the entire reception circuit 30. However, the pattern may also be formed on the circuit board 51 so as to enclose only the oscillator 36 of the reception circuit 30, provided that it is possible to secure a sufficiently large size of the second antenna 50. Further, in the previous embodiment, the second antenna 50 is formed as a loop antenna. However, the second antenna 50 may also be formed as any other type of antenna. In addition, it should be noted that the second antenna 50 is not necessarily formed on the circuit board 51.

Figure 12:
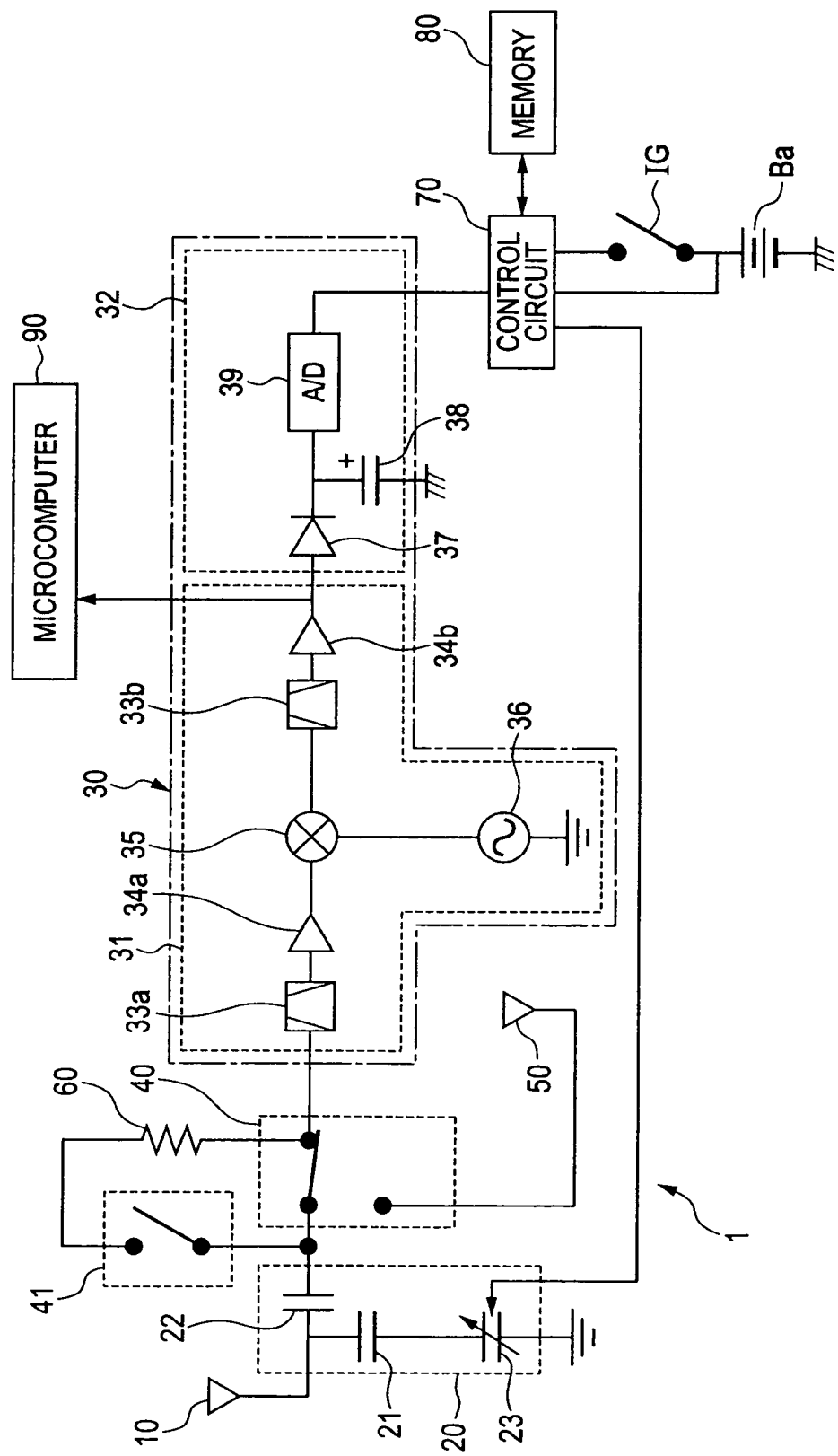
FIG. 12 is a schematic circuit diagram illustrating a modification of the wireless communication apparatus.

In the previous embodiment, as shown in FIG. 1, the second switch 41 and the resistor element 60 are arranged between the first antenna 10 and the reception circuit 30. However, as shown in FIG. 12, the second switch 41 and the resistor element 60 may also be arranged between the impedance matching circuit 20 and the reception circuit 30.

In the previous embodiment, the wireless communication apparatus 1 includes the second antenna 50 for receiving the frequency signal output from the oscillator 36 of the reception circuit 30 as a radio wave.

Figure 13:
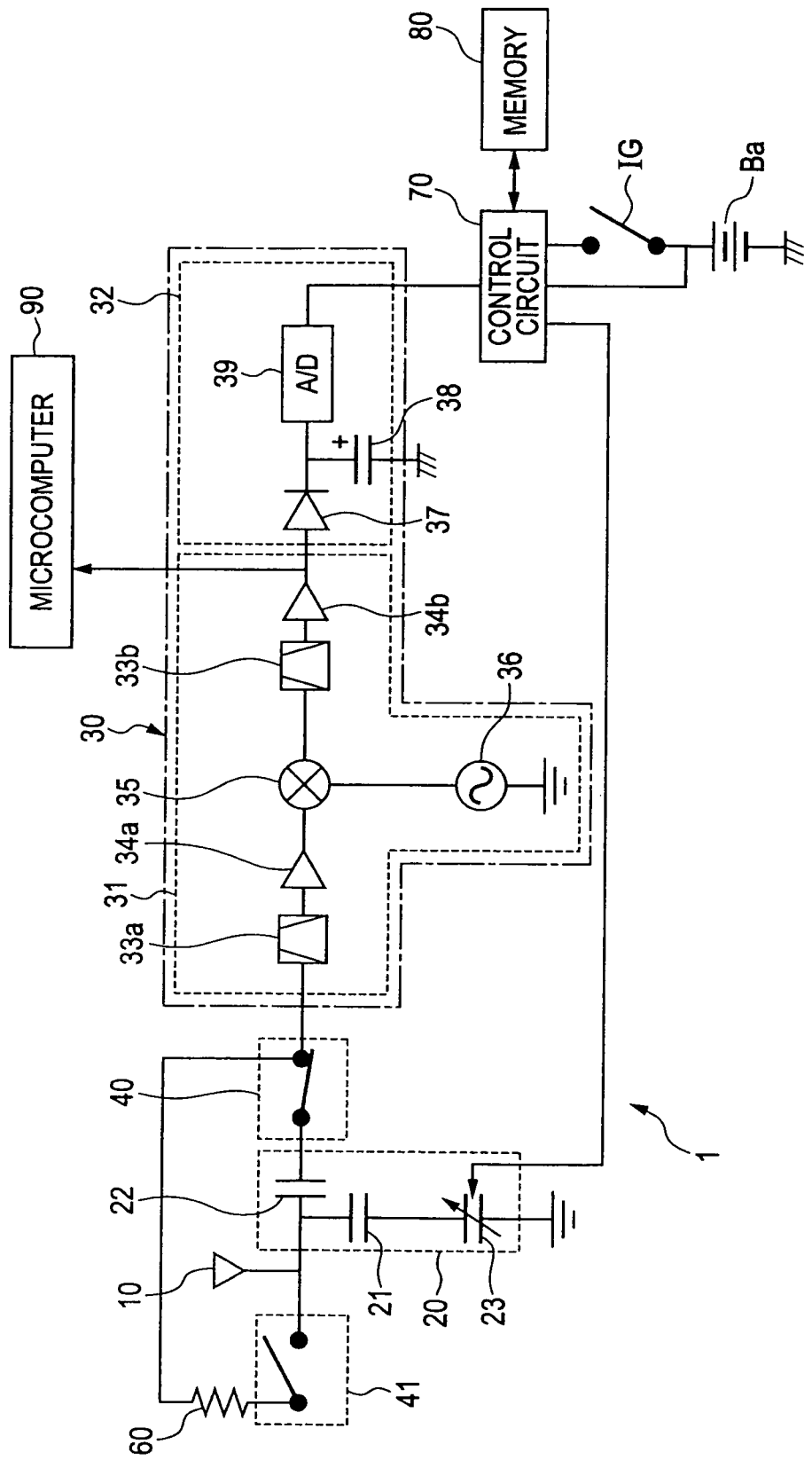
FIG. 13 is a schematic circuit diagram illustrating another modification of the wireless communication apparatus.

However, as shown in FIG. 13, it is also possible to modify the wireless communication apparatus 1 to omit the second antenna 50 therefrom. In this case, the frequency signal output from the oscillator 36 may be received as a radio wave by the first antenna 10 instead, and the first antenna 10 and the impedance matching circuit 20 may together form a resonance circuit that resonates in response to the frequency signal received by the first antenna 10. That is, the first antenna 10 may function as a common antenna for receiving both the predetermined signals transmitted by the portable transmitter and the frequency signal output by the oscillator 36. Moreover, in this case, it is necessary to modify the first switch 40 to selectively electrically connect and disconnect only the impedance matching circuit 20 to and from the reception circuit 30.

In the previous embodiment, if the RSSI voltage is determined as being higher than the reference RSSI V0, the control circuit 70 gradually increases the capacitance of the variable-capacitance capacitor 23 within the first sweep range Wb from C0 until the RSSI voltage becomes equal to V0. However, in this case, it is also possible for the control circuit 70 to vary the capacitance of the capacitor 23 within the first sweep range Wb in any other suitable manner until the RSSI voltage becomes equal to V0.

Similarly, in the previous embodiment, if the RSSI voltage is determined as being lower than V0, the control circuit 70 gradually decreases the capacitance of the capacitor 23 within the second sweep range Wc from C0 until the RSSI voltage becomes equal to V0. However, in this case, it is also possible for the control circuit 70 to vary the capacitance of the capacitor 23 within the second sweep range Wc in any other suitable manner until the RSSI voltage becomes equal to V0.

In the previous embodiment, the control circuit 70 performs the tuning process shown in FIG. 9 once each time the ignition switch IG of the vehicle is turned from off to on. However, it is also possible to configure the control circuit 70 to perform the tuning process only once immediately after the mounting of the wireless communication apparatus 1 on the vehicle.

In the previous embodiment, the reception circuit 30 is configured as a superheterodyne-type reception circuit. However, provided that the predetermined frequency F0 of the frequency signal output from the oscillator 36 is different from the reference frequency Fa, the reception circuit 30 may also be configured as, for example, a direct conversion-type reception circuit.

In the previous embodiment, the current limiter for limiting the current flowing from the first antenna 10 to the reception circuit 30 in the tuning mode is implemented by the resistor element 60 that has an extremely high resistance and is electrically connected between the second switch 41 and the reception circuit 30. However, the current limiter may also be implemented by, for example, an inductor having a high inductance. Furthermore, when the input impedance of the filter 33a of the reception circuit 30 is sufficiently high, it is even possible to omit the current limiter from the wireless communication apparatus 1.

In the previous embodiment, the predetermined frequency F0 of the frequency signal output by the oscillator 36 is set to be higher than the reference frequency Fa. However, the predetermined frequency F0 may also be set to be lower than the reference frequency Fa.

In the previous embodiment, the impedance matching circuit 20 includes the variable-capacitance capacitor 23, and the impedance of the impedance matching circuit 20 is varied by varying the capacitance of the capacitor 23. However, the impedance matching circuit 20 may also include, instead of the variable-capacitance capacitor 23, a variable-inductance inductor so that the impedance of the impedance matching circuit 20 can be varied by varying the inductance of the inductor.

In the previous embodiment, the wireless communication apparatus 1 is employed as a receiver in the Smart Entry System. However, the wireless communication apparatus 1 may also be used in, for example, airplanes, trains and marine vessels. Further, the wireless communication apparatus 1 may also be employed in a ground-based wireless communication system.

What is claimed is:

1. A wireless communication apparatus comprising:
a first antenna for receiving a predetermined signal that is transmitted by an external transmitter at a reference frequency;
a reception circuit including a frequency conversion circuit and a signal strength detection circuit, the frequency conversion circuit including an oscillator that outputs a frequency signal at a predetermined frequency and being configured to frequency-convert signals input to the reception circuit based on the frequency signal output from the oscillator, the signal strength detection circuit being configured to detect strength of the frequency-converted signals output from the frequency conversion circuit and output an RSSI (Received Signal Strength Indication) voltage that represents the detected strength;
an impedance matching circuit that performs impedance matching between the first antenna and the reception circuit, the impedance matching circuit having a variable impedance;
a second antenna for receiving the frequency signal output from the oscillator of the frequency conversion circuit of the reception circuit;
a first switch that is arranged to selectively electrically connect one of the two antennas and the reception circuit to the impedance matching circuit while disconnecting the other antenna from the impedance matching circuit;
a second switch that is arranged to selectively electrically connect and disconnect the first antenna to and from the reception circuit;
a signal processor that, when the first switch electrically connects the reception circuit to the impedance matching circuit and the second switch electrically disconnects the first antenna from the reception circuit so that the predetermined signal received by the first antenna is input to the frequency conversion circuit of the reception circuit via the impedance matching circuit and the first switch, processes the frequency-converted signal output from the frequency conversion circuit; and
a controller that, when the first switch electrically connects the second antenna to the impedance matching circuit and the second switch electrically connects the first antenna to the reception circuit so that the frequency signal received by the second antenna is applied to the impedance matching circuit, controls the impedance of the impedance matching circuit so as to bring the RSSI voltage output from the signal strength detection circuit of the reception circuit into agreement with a reference RSSI voltage.

2. The wireless communication apparatus as set forth in claim 1, wherein the reception circuit is provided on a circuit board, and the second antenna is made up of a pattern that is formed on the circuit board so as to enclose at least the oscillator of the frequency conversion circuit of the reception circuit.

3. The wireless communication apparatus as set forth in claim 2, wherein the pattern making up the second antenna is formed on the circuit board so as to enclose the entire reception circuit.

4. The wireless communication apparatus as set forth in claim 1, wherein the impedance matching circuit includes a variable-capacitance capacitor and the controller controls the impedance of the impedance matching circuit by controlling the capacitance of the variable-capacitance capacitor, and
the controller is configured to
determine whether the RSSI voltage output from the signal strength detection circuit is higher or lower than the reference RSSI voltage,
vary the capacitance of the variable-capacitance capacitor within a first sweep range, when the RSSI voltage is determined as being higher than the reference RSSI voltage, until the RSSI voltage becomes equal to the reference RSSI voltage, and
vary the capacitance of the variable-capacitance capacitor within a second sweep range, when the RSSI voltage is determined as being lower than the reference RSSI voltage, until the RSSI voltage becomes equal to the reference RSSI voltage, and
the first sweep range has its lower limit set to an initial value of the capacitance, and the second sweep range has its upper limit set to the initial value.

5. The wireless communication apparatus as set forth in claim 1, further comprising a current limiter that is electrically connected between the second switch and the reception circuit to limit current flowing from the first antenna to the reception circuit via the second switch.

6. The wireless communication apparatus as set forth in claim 1, wherein the predetermined frequency of the frequency signal output by the oscillator is set to be different from the reference frequency of the predetermined signal transmitted by the external transmitter.

7. The wireless communication apparatus as set forth in claim 1, wherein the wireless communication apparatus is employed as a receiver in a remote keyless entry system for a vehicle and mounted on the vehicle, and the external transmitter is a portable transmitter of the system.

8. A wireless communication apparatus comprising:
an antenna for receiving both a predetermined signal that is transmitted by an external transmitter at a reference frequency and a frequency signal that is output by an oscillator at a predetermined frequency;
a reception circuit including a frequency conversion circuit and a signal strength detection circuit, the frequency conversion circuit including the oscillator and being configured to frequency-convert signals input to the reception circuit based on the frequency signal output from the oscillator, the signal strength detection circuit being configured to detect strength of the frequency-converted signals output from the frequency conversion circuit and output an RSSI (Received Signal Strength Indication) voltage that represents the detected strength;
an impedance matching circuit that performs impedance matching between the antenna and the reception circuit, the impedance matching circuit having a variable impedance;
a first switch that is arranged to selectively electrically connect and disconnect the impedance matching circuit to and from the reception circuit;
a second switch that is arranged to selectively electrically connect and disconnect the antenna to and from the reception circuit;
a signal processor that, when the first switch electrically connects the impedance matching circuit to the reception circuit and the second switch electrically disconnects the antenna from the reception circuit so that the predetermined signal received by the antenna is input to the frequency conversion circuit of the reception circuit via the impedance matching circuit and the first switch, processes the frequency-converted signal output from the frequency conversion circuit; and a controller that, when the first switch electrically disconnects the impedance matching circuit from the reception circuit and the second switch electrically connects the antenna to the reception circuit so that the frequency signal received by the antenna is applied to the impedance matching circuit, controls the impedance of the impedance matching circuit so as to bring the RSSI voltage output from the signal strength detection circuit of the reception circuit into agreement with a reference RSSI voltage.

9. The wireless communication apparatus as set forth in claim 8, wherein the impedance matching circuit includes a variable-capacitance capacitor and the controller controls the impedance of the impedance matching circuit by controlling the capacitance of the variable-capacitance capacitor, and the controller is configured to determine whether the RSSI voltage output from the signal strength detection circuit is higher or lower than the reference RSSI voltage, vary the capacitance of the variable-capacitance capacitor within a first sweep range, when the RSSI voltage is determined as being higher than the reference RSSI voltage, until the RSSI voltage becomes equal to the reference RSSI voltage, and vary the capacitance of the variable-capacitance capacitor within a second sweep range, when the RSSI voltage is determined as being lower than the reference RSSI voltage, until the RSSI voltage becomes equal to the reference RSSI voltage, and the first sweep range has its lower limit set to an initial value of the capacitance, and the second sweep range has its upper limit set to the initial value.

10. The wireless communication apparatus as set forth in claim 8, further comprising a current limiter that is electrically connected between the second switch and the reception circuit to limit current flowing from the antenna to the reception circuit via the second switch.

11. The wireless communication apparatus as set forth in claim 8, wherein the predetermined frequency of the frequency signal output by the oscillator is set to be different from the reference frequency of the predetermined signal transmitted by the external transmitter.

12. The wireless communication apparatus as set forth in claim 8, wherein the wireless communication apparatus is employed as a receiver in a remote keyless entry system for a vehicle and mounted on the vehicle, and the external transmitter is a portable transmitter of the system.

* * * * *

UNITED STATES PATENT AND TRADEMARK OFFICE
CERTIFICATE OF CORRECTION

Page 1 of 1

PATENT NO. : 8,463,200 B2
APPLICATION NO. : 13/068740
DATED : June 11, 2013
INVENTOR(S) : Yuuji Kakuya et al.

It is certified that error appears in the above-identified patent and that said Letters Patent is hereby corrected as shown below:

In the Claims

Col. 17, line 33, claim 1, delete "two antennas", and insert -- second antenna --

Col. 17, line 35, claim 1, delete "antenna", and insert -- of the second antenna and the reception circuit --

Signed and Sealed this
Twenty-fourth Day of September, 2013

Teresa Stanek Rea
*Deputy Director of the United States Patent and Trademark Office*